United States Patent
Egitto et al.

(10) Patent No.: US 7,307,022 B2
(45) Date of Patent: Dec. 11, 2007

(54) METHOD OF TREATING CONDUCTIVE LAYER FOR USE IN A CIRCUITIZED SUBSTRATE AND METHOD OF MAKING SAID SUBSTRATE HAVING SAID CONDUCTIVE LAYER AS PART THEREOF

(75) Inventors: Frank D. Egitto, Binghamton, NY (US); Stephen Krasniak, Owego, NY (US); John M. Lauffer, Waverly, NY (US); Voya R. Markovich, Endwell, NY (US); Luis J. Matienzo, Endicott, NY (US)

(73) Assignee: Endicott Interconnect Technologies, Inc., Endicott, NY (US)

(*) Notice: Subject to any disclaimer, the term of this patent is extended or adjusted under 35 U.S.C. 154(b) by 196 days.

(21) Appl. No.: 11/327,493

(22) Filed: Jan. 9, 2006

(65) Prior Publication Data
US 2006/0121738 A1 Jun. 8, 2006

Related U.S. Application Data

(63) Continuation-in-part of application No. 10/991,451, filed on Nov. 19, 2004, now Pat. No. 6,964,884.

(51) Int. Cl.
*H01L 21/44* (2006.01)
*C25D 5/02* (2006.01)

(52) U.S. Cl. .............. 438/692; 257/E21.582; 205/125

(58) Field of Classification Search ........ 438/652; 257/E21.582; 205/125, 170
See application file for complete search history.

(56) References Cited

U.S. PATENT DOCUMENTS

| | | | |
|---|---|---|---|
| 5,063,951 A | 11/1991 | Bard et al. | |
| 5,096,522 A | 3/1992 | Kawachi et al. | |
| 5,289,639 A | 3/1994 | Bard et al. | |
| 5,378,307 A | 1/1995 | Bard et al. | |
| 5,437,914 A | 8/1995 | Saida et al. | |
| 5,482,784 A | 1/1996 | Ohara et al. | |
| 5,512,335 A | 4/1996 | Miller et al. | |
| 5,545,466 A | 8/1996 | Saida et al. | |
| 5,622,782 A | 4/1997 | Poutasse et al. | |
| 5,779,870 A * | 7/1998 | Seip ............................ | 205/77 |
| 5,897,761 A | 4/1999 | Tagusari et al. | |
| 6,194,317 B1 * | 2/2001 | Kaisaki et al. ............... | 438/692 |
| 6,291,081 B1 | 9/2001 | Kurabe et al. | |
| 6,475,638 B1 | 11/2002 | Mitsuhashi et al. | |
| 6,828,514 B2 | 12/2004 | Chan et al. | |

FOREIGN PATENT DOCUMENTS

JP   HEI 5-160208   6/1993

* cited by examiner

*Primary Examiner*—Lex Malsawma
(74) *Attorney, Agent, or Firm*—Hinman, Howard & Kattell, LLP; Lawrence R. Fraley

(57) ABSTRACT

A method of treating a conductive layer to assure enhanced adhesion of the layer to selected dielectric layers used to form a circuitized substrate. The conductive layer includes at least one surface with the appropriate roughness to enable such adhesion and also good signal passage if the layer is used as a signal layer. The method is extendible to the formation of such substrates, including to the formation of multilayered substrates having many conductive and dielectric layers. Such substrates may include one or more electrical components (e.g., semiconductor chips) mounted thereon and may also be mounted themselves onto other substrates.

21 Claims, 3 Drawing Sheets

METHOD OF TREATING CONDUCTIVE LAYER FOR USE IN A CIRCUITIZED SUBSTRATE AND METHOD OF MAKING SAID SUBSTRATE HAVING SAID CONDUCTIVE LAYER AS PART THEREOF

This application is a continuation-in-part of Ser. No. 10/991,451 filed Nov. 19, 2004 now U.S. Pat No. 6,964,884.

TECHNICAL FIELD

The invention relates to methods of treating conductive layers for use in circuitized substrates, e.g., as ground, power and signal layers, and to methods for making such substrates. One primary example of such a circuitized substrate is a printed circuit (or wiring) board (or card) and another is a chip carrier substrate, both of which are produced by the Assignee of the present invention.

CROSS REFERENCE TO CO-PENDING APPLICATION

In Ser. No. 10/991,451, entitled "Circuitized Substrate Utilizing Smooth-Sided Conductive Layers As Part Thereof, Method Of Making Same, And Electrical Assemblies And Information Handling Systems Utilizing Same", filed Nov. 19, 2004 and assigned to the same Assignee as the present invention, there is defined a substrate in which two conductive layers (e.g., electroplated copper foil) are bonded (e.g., laminated) to an interim dielectric layer. Each of the two foil surfaces which physically bond to the dielectric are smooth (e.g., preferably by chemical processing) and include a thin, organic layer thereon, while the outer surfaces of both foils are also smooth (e.g., preferably also using a chemical processing step). One of these resulting conductive layers may function as a ground or voltage plane while the other may function as a signal plane with a plurality of individual signal lines as part thereof. An electrical assembly and an information handling system utilizing such a circuitized substrate are also defined, as is a method of making the substrate.

BACKGROUND OF THE INVENTION

Presently, there are various approaches to treating conductive layers for eventual utilization in printed circuit boards and cards (hereinafter also simply referred to as PCBs), chip carriers and the like substrates. Examples of same are described below, including within the several patents listed. With respect to the circuit (wiring) patterns being formed on many types of substrates, particularly PCBs (including those known as "high speed" boards described below), line widths may now be as small as ten-odd microns. Accordingly, the conductive layers (some also referred to as metal "foils" in the art) are becoming much thinner than those which produced wider lines in previous substrates. By way of example, when the designated thickness of metal foil for use in the formation of the conventional wiring pattern of about 100 micron line width has ranged from about 15 to 35 microns, the thickness of metal foil utilized in the formation of ten-odd micron wiring patterns must be reduced correspondingly. To accomplish this, an aluminum or copper foil may be used. Preferably, copper is used, especially an electrodeposited copper foil, produced by electrodepositing copper on a drum surface.

With respect to such electrodeposited copper foil, the surface at which copper deposition is initiated (the surface in contact with the drum) is referred to as the "shiny side", and the surface at which copper deposition is completed is referred to as the "matte side". The surface condition of the shiny side is substantially the same as that of the drum. That is, the RMS surface roughness value (a conventional measurement of metal surface roughness for layers used in PCBs; see more below) of the drum is from about 0.1 to 0.5 microns with a maximum peak to valley roughness value from about 1.0 to 2.0 microns. (Maximum peak to valley roughness is another means of characterizing surface roughness of a metal layer such as copper foil used in PCBs) As a result, the "shiny" side of the electrodeposited copper formed on this drum (and against the drum's outer surface) has a similar roughness. On the other hand, with respect to the outer matte side of the formed copper layer, its surface roughness is greater than the surface roughness of the shiny side, typically having an RMS value of from about 1.0 to about 2.0 microns with a maximum peak to valley roughness in the range of about 3.0 to 10 microns.

There are various different methods of characterizing surface roughness in the industry including Ra (average roughness or the arithmetic average above and below the center line in a segment), Rq (or RMS, which is the square root of the average of the squared absolute distances of the surface profile from the mean line), Rt (maximum peak to valley or the height difference between the highest and lowest points in a segment) and Rz (the 10 point average surface roughness). Unless otherwise specified, RMS (Rq) values will be used herein and simply referred to as "RMS roughness" for ease of explanation purposes.

With regard to conventional electrodeposited and similar copper foils, it is known to subject these foils to various treatments prior to inclusion thereof as part of a dielectric-conductive layer multilayered composite structure (these sometimes also referred to as "sub-composites" if used in combination with other "sub-composites" to form such a larger, multilayered product), including treating the foil for the purpose of increasing adhesion between the foil and dielectric layer(s) in the final structure. For example, mechanical polishing is a method of smoothing the surface of the copper foil with the use of mechanical means, usually in the form of a buffer. Unfortunately, if the foil is too thin, it may be damaged, e.g., severed or torn in sections, from the relatively high stresses exerted on the copper foil during this processing. Thus, mechanical polishing is only considered suitable for preparing the surface of relatively thick copper foils. In comparison, chemical and electrolytic polishing processes exert virtually no relatively high stresses on copper foils so it is believed that relatively thin foils may be successfully treated using one or both of these processes. However, such processes are typically expensive to operate, often requiring relatively expensive equipment, costly chemical baths, as well as prolonged periods during which the foil is so treated, thereby extending the total time of manufacture of the end product. It is also known to "treat" the surfaces of copper conductive foils (or sheets) by electroplating additional copper onto the surface to increase its roughness. Such plating may further involve electroplating minor amounts of chromium followed by a thin layer of zinc, this also increasing the roughness.

The use of properly faced conductive layers is especially important with respect to the aforementioned "high speed" substrate products. With operational requirements increasing for complex electronic components such as semiconductor chips which mount on circuitized substrates of the types cited above, so too must the host substrate be capable of handling these increased requirements. One particular increased requirement has been the need for higher frequency (high speed) connections between two or more such mounted components, which connections, as stated, occur through the underlying host substrate. By the term "high speed" as used herein is understood to mean signals within a frequency range of from about 3.0 to about 10.0 gigabits per second (GPS) and even higher.

Such high-speed connections are subjected to various detrimental effects, e.g., signal deterioration (also referred to as signal attenuation), caused by the inherent characteristics of such known substrate circuitry wiring. In the particular case of signal deterioration, this effect is expressed in terms of either the "rise time" or the "fall time" of the signal's response to a step change. The deterioration of the signal can be quantified with the formula $(Z_0 *C)/2$, where $Z_0$ is the transmission line characteristic impedance, and C is the amount of the connecting "via" capacitance (the "via" being a known plated hole within the substrate to couple different conductive layers). In a signal line (also referred to in the industry as a wire or trace) having a typical 50 ohm transmission line impedance, a plated thru-hole "via" having a capacitance of 4 pico-farads (pf) would represent a 100 pico-second (ps) rise-time (or fall time) degradation. This compares to a 12.5 ps degradation with a 0.5 pf buried "via" of the various embodiments taught in the patent application cited above. This difference is significant in systems which operate at 800 MHz or faster (becoming the "norm" in today's technical world), where there are associated signal transition rates of 200 ps or faster.

One factor which can contribute to signal attenuation is, indeed, the surface roughness of the conductive layer through which the signals pass. As understood from the foregoing, PCB and other substrate manufacturers who laminate several dielectric and conductive layers to form the final board structure desire some level of roughness to promote adhesion between the two materials. Unfortunately, such roughness may also adversely affect signal passage if too excessive. As understood from the teachings herein, the instant invention is able to provide conductive layers with optimal roughness for sound adhesion to corresponding dielectric layers during bonding of such layers but also layers that are smooth enough that the surface irregularities of such layers do not significantly impede signal passage.

The teachings of the present invention are not limited to the manufacture of high speed substrates such as PCBs and the like, but are also applicable to the manufacture of substrates used for other purposes than high speed signal connections. Generally speaking, the teachings herein are applicable to any such substrates in which one or more conductive layers such as copper are bonded (e.g., laminated) to an adjacent dielectric layer and the resulting composite then used as the substrate, typically when combined with other dielectric and conductive layers to form a much thicker, built-up structure. The invention is able to provide a final structure in which signal attenuation is reduced while still assuring effective conductive layer and dielectric layer adhesion.

Examples of various methods for treating conductive layers and the products utilizing same are described in the U.S. Letters Patents and Japanese Patent Unexamined Publication listed below.

In U.S. Pat. No. 6,828,514 (Chan et al), assigned to the same Assignee as the present invention, there is defined a multilayered circuitized substrate including two multilayered portions, one of these able to electrically connect electronic components mounted on the substrate to assure high frequency connections there-between. The substrate may further include a "conventional" substrate portion of known materials so as to reduce costs while assuring a structure having an overall thickness deemed satisfactory for use in the respective product field.

In U.S. Pat. No. 6,475,638 (Mitsuhashi et al), there is described a process for producing an electrodeposited copper foil with its surface prepared which includes the steps of subjecting the foil having a shiny side and a matte side to at least one mechanical polishing so that the average surface roughness (Rz) of the matte side becomes in the range of 1.5 to 3.0 microns. The matte side is then subjected to a selective chemical polishing so that the average surface roughness (Rz) of the matte side becomes in the range of 0.8 to 2.5 microns. The mechanical polishing followed by chemical polishing of the matte side enables the foil to exhibit excellent properties, according to the authors.

In U.S. Pat. No. 6,291,081 (Kurabe et al), there is described a process for producing an electrodeposited copper foil including the steps of subjecting an electrodeposited copper foil having a shiny side and a matte side to a first mechanical polishing and then subjecting the matte side having undergone the first mechanical polishing to a further mechanical polishing. A planar, highly polished face with excellent surface properties is allegedly obtained. Moreover, depressed parts are not polished, so that the amount of copper lost by the polishing steps is extremely minute.

In U.S. Pat. No. 5,897,761 (Tagusari et al), there is described an electrodeposited copper foil for use in the manufacture of PCBs in which the original profile of the matte surface has been completely removed, preferably by buffing, leaving a surface having linear streaks and a certain roughness. The new surface is then given a nodule forming treatment which produces a second surface roughness, which may be followed by a corrosion resisting treatment. U.S. Pat. No. 5,858,517 (also Tagusari et al) also describes a similar process with what are considered minor modifications.

In U.S. Pat. No. 5,622,782 (Kovacs et al) there is described a foil having an adhesion promoting layer overlying at least one side of said foil. The adhesion promoting layer is suitable for enhancing adhesion between the foil and another substrate. The adhesion promoting layer is derived from a composition comprising silanes (A) and (B). Silane (A) is at least one compound including independently halogen, hydrocarbyloxy, or hydroxy groups and a hydrocarbon group or nitrogen-containing hydrocarbon group. Silane (B) is at least one compound including an organofunctional group being reactive with or having an affinity for said another substrate, and independently halogen, hydrocarbyloxy, or hydroxy groups.

In U.S. Pat. No. 5,545,466 (Saida et al), there is described a copper-clad laminate characterized in that an electrolytic copper foil on the glossy (shiny) surface side of which a copper electrodeposit is formed, is bonded at its glossy surface side to one side or each of both sides of a substrate, which has a fine-pitch wiring (circuit) pattern and exhibits a high etching factor. This patent is a continuation-in-part of U.S. Pat. No. 5,437,914 (Saida et al), below.

In U.S. Pat. No. 5,482,784 (Ohara et al), there is described a printed circuit inner-layer copper foil having inverted tear drop-shaped fine nodules formed on both surfaces of the copper foil, the nodules each having a specific length and maximum diameter.

In U.S. Pat. No. 5,437,914 (Saida et al), there is described a copper-clad laminate characterized in that an electrolytic copper foil on the glossy surface side of which a copper electrodeposit is formed is bonded at its glossy surface side to one side or each of both sides of a substrate.

In U.S. Pat. No. 5,096,522 (Kawachi et al), there is described a process for producing a copper-clad laminate which includes the steps of contacting the surface of a conductive carrier with a catalyst liquid containing a noble metal selected from the group consisting of Pd, Pt, Ru, Au, and Ag, subsequently forming a copper foil layer on the treated surface by copper electroplating, laminating an insulating base on the copper foil layer by hot-press bonding, and then separating the conductive carrier from the resulting laminate. The copper foil layer in the resulting copper-clad laminate is claimed to have fewer pinholes and allegedly exhibits isotropic mechanical characteristics.

In Japanese Patent Unexamined Publication Hei 5-160208, there is disclosed a tape carrier having a lead pattern formed from an electrodeposited copper foil wherein the overall surface of the foil's matte side has been polished. This publication describes the use of an electrodeposited copper foil whose 1-2 micron matte side surface profile has been chemically polished. It is mentioned that a highly reliable carrier tape with desired lead strength can be provided by the use of the copper foil whose matte side overall surface has been so chemically polished.

According to the teachings of the present invention, there is defined a method of treating conductive layers for use in circuitized substrate in which the conductive layers (e.g., electroplated copper foil) are adapted for mating with other layers and bonded (e.g., laminated) thereto. Surfaces of the conductive layers are roughened using this new process to the extent these surfaces fully bond to the dielectric to prevent subsequent delamination but not to the extent the surfaces adversely affect signal passage. These resulting conductive layers may function as ground, voltage and/or signal planes, depending on the operational requirements of the finished substrate. If a signal plane, the signal lines may be extremely thin and also extremely narrow in width, in which case these are still able to enable the passage of high speed signals there-through. As stated, however, the invention is not limited to substrates with extremely thin and narrow signal lines, as it is clear from the teachings herein that substrates having thicker and wider lines than defined herein may be successfully produced.

It is believed that such a method of treating such conductive layers and an associated method of making the substrate having one or more such layers therein will constitute significant advancements in the art.

OBJECTS AND SUMMARY OF THE INVENTION

It is, therefore, a primary object of the present invention to enhance the circuitized substrate art by providing a method of making a circuitized substrate having one or more conductive layers possessing the advantageous features taught herein.

It is another object of the invention to provide a method of treating such conductive layers to assure sound adhesion to the substrate's dielectric layers as well as which promote signal passage and other conductive properties.

It is still another object of the invention to provide such methods which can be accomplished in a relatively facile manner and at relatively low cost in comparison to some known substrate processes.

According to one aspect of the invention, there is provided a method of treating a conductive layer for use in a circuitized substrate, the method comprising providing a conductive layer of a first metal having at least one smooth side including a first roughness, depositing a layer of a second metal different than the first metal on the smooth side of the conductive layer, exposing the layer of second metal to a solution to reduce the amount of second metal within this layer, and providing a thin polymer layer on the layer of second metal after reducing the second metal, to protect the layer of second metal and to increase the roughness of the conductive layer to a second roughness greater than the first roughness.

According to another aspect of the invention, there is provided a method of making a circuitized substrate in which the method comprises providing a conductive layer of a first metal having at least one smooth side including a first roughness, depositing a layer of a second metal different than the first metal on the smooth side of the conductive layer, exposing the layer of second metal to a solution to reduce the amount of second metal within this layer, providing a thin polymer layer on the layer of second metal after reducing the second metal, to protect the layer of second metal and to increase the roughness of the conductive layer to a second roughness greater than the first roughness, providing a dielectric layer, bonding the conductive and dielectric layers, and forming a circuit within the conductive layer.

BEST MODE FOR CARRYING OUT THE INVENTION

Figure 1:
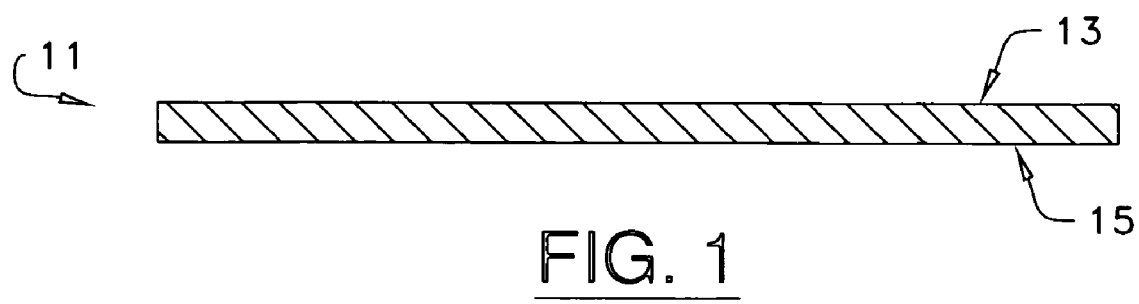
FIGS. 1-4 are much enlarged, partial side elevational views, in section, which illustrate four of the steps used to treat a conductive layer for used in a circuitized substrate, according to one embodiment of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "circuitized substrate" as used herein is meant to include substrates having at least one dielectric layer and at least one metal conductive layer. Examples of dielectric materials include fiberglass-reinforced epoxy resins (some referred to as "FR-4" dielectric materials in the art), polytetrafluoroethylene (Teflon), polyimides, polyamides, cyanate resins, polyphenylene ether resins, photoimageable materials, and other like materials wherein the conductive layer(s) is(are) comprised of metal such as copper (preferably electrodeposited copper foil as defined herein-above), and function as a power, signal and/or ground layer. In the broader aspects, the metal may be other than copper or copper alloy (e.g., nickel, aluminum, etc.) or alloys thereof. In preferred embodiments, the circuitized substrate will be comprised of several conductive and dielectric layers, sandwiched together in alternating orientation, and preferably bonded using conventional lamination. One particular example of dielectric materials for use herein include what are referred to as "APPE" dielectric materials, these being polymer films including allylated poly(phenylene ether). Such polymer film dielectric layers are available from Asahi Chemical Company, having a business address at 1-2 Yurakucho 1-chome, Chiyoda-ku, Tokyo, Japan, and sold under the product designation "PC5103." Another dielectric material adapted for use with the invention is a photoimageable material, which is photoimaged or photopatterned, and developed to reveal the desired circuit pattern, including the desired opening(s) as defined herein, if required. The dielectric material may be curtain-coated or screen-applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about two mils to about four mils thick, but also thicker if desired. Examples of some known circuitized substrates include printed circuit boards (PCBs) and chip carriers. It is believed that the teachings of the instant invention are also applicable to what are known as "flex" circuits (which use dielectric materials such as polyimide).

By the term "electrical component" as used herein is meant components such as semiconductor chips, resistors, capacitors and the like, which are adapted for being positioned on the external conductive surfaces of such substrates as PCBs and chip carriers, and possibly electrically coupled to other components, as well as to each other, using, for example the PCB's or chip carrier's internal and/or external circuitry. The circuitized substrates formed in accordance with the teachings herein are readily adaptable for having one or more such electrical components positioned thereon and electrically coupled to the internal circuitry thereof, as well as to each other if so desired.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the carrier's circuitized substrate and coupled to wiring (e.g., pads) on the substrate's outer surface or to internal conductors using one or more thru-holes. Perhaps the most well known such assembly, however, is the conventional PCB having several external components such as resistors, capacitors, modules (including one or more chip carriers) etc. mounted thereon and coupled to the internal circuitry of the PCB.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "smooth" as used herein to define the surface roughness of a side of an electrically conductive layer (such as an electrodeposited copper foil) is meant a layer having an RMS surface roughness of from about 0.1 to about 0.6 microns.

In the four U.S. Patents cited in this paragraph, there are described various embodiments of "fluid treatment devices" which are specifically designed for applying precisely directed pressurized jets of fluid onto designated locations on the surface of a nearby material. As defined in these patents, such materials are typically passed through the apparatus/assembly with the fluid directed onto opposite sides thereof from the oppositely positioned sprayers, but may only be directed onto one of the sides, if desired. The various pressures attainable using these structures are defined in detail in many of these patents. By the term "fluid treatment device" as used herein is meant a pressurized fluid spray apparatus/assembly adapted for precisely directing pressurized jets of fluid onto the surface of a material, typically as the material is passed there-through in the situation where such jets impinge from opposite sides of the material or, in its simplest form, where such apparatus/assembly utilizes such jets only on one side of the material and thus fluid is impinged on only said side. Apparatus/assemblies of this type are defined in U.S. Pat. No. 5,512,335 (Miller et al), U.S. Pat. No. 5,378,307 (Bard et al), U.S. Pat. No. 5,289,639 (Bard et al) and U.S. Pat. No. 5,063,951 (Bard et al), the teachings of these patents being incorporated herein by reference. In its simplest form, such as shown in U.S. Pat. Nos. 5,063,951 and 5,289,639, the device will include a plurality of such jets oriented in rows under or over which the material being treated will pass and receive pressurized fluid, e.g., etchants, water rinse, etc. thereon. Additional structure, such as vibration means may be utilized, as defined in U.S. Pat. No. 5,512,335, as well as an overflow sump arrangement with a plurality of such devices spacedly positioned there-along. An example of this latter apparatus/assembly is defined in U.S. Pat. No. 5,378,307.

In FIG. 1, a foil 11 of electrically conductive material, preferably "standard" or "plain and stable" electrodeposited copper foil, is provided. In this form, foil 11 will include what will be referred to as a first side 13 and a second, opposing side 15. By way of example, side 13, the "drum" side (meaning it was formed against the drum surface), may include an RMS roughness of about 0.1 to about 0.5 microns and can thus be defined as falling within the "smooth" range stipulated above. The maximum peak-to-valley roughness (hereinafter PTV roughness) value for this side is preferably from about 1.0 micron to about 2.0 microns with an optimal value being 1.5 microns. Side 15, referred to as the "matte" side if an electrodeposited copper foil (meaning it was not against the drum), is initially rougher and, in this same example, may possess an initial roughness using the same RMS standard of about 1.0 to about 3.0 microns with a maximum PTV roughness from about 2.5 to about 10.0 microns. In a preferred embodiment of the invention, side 15 is also "smooth", however, such that its surface meets the criteria stated herein, so it is preferred to further treat this surface if it has such an initial roughness when removed from the electro-deposition drum. By the term "plain and stable" when defining electrodeposited copper foil is meant a copper foil which has not received additional surface roughening treatment (e.g. a secondary nodular plating), but may have been given a known chemical anti-stain treatment. By the term "standard" when defining electrodeposited copper foil is meant a copper foil that may have received additional roughening treatment (e.g. a secondary nodular plating) to its' matte surface, and has additionally received a chemical anti-stain treatment to both surfaces. Either type of such foils is well adapted for use in the present invention, as are others known in the art.

As stated, a key aspect of this invention is the provision of properly roughened external surfaces of the conductive layers such that, when bonded to one or more dielectric layers of conventional material (e.g., such as the above Asahi Chemical Company's APPE-based dielectric material), the result is a final circuitized substrate which, if signal layers are part thereof, functions to substantially prevent signal attenuation when signals are passed there-through, but which are also "rough" enough to promote secure adhesion to the corresponding dielectric layer(s) when bonded thereto, including using such relatively harsh PCB-type production processes as lamination. In the example presented above, copper conductive layer 11 possesses an initial thickness of from about 1 mil (thousandths of an inch) to about 3 mils.

Foil 11 is now subjected to further treatment in which a layer of a second metal is added to at least one (and preferably both) of the external surfaces. In a preferred embodiment, this involves electrolytic plating of a first sub-layer 17, preferably of chromium, zinc, or a chromium-zinc alloy. This plating is followed by another electrolytic plating of a second sub-layer 19, preferably of zinc. The terminology of a "layer" of a "second metal" as used in this context, therefore, is meant to define a layer in which at least one and preferably two or more sub-layers may be formed, including of metals other than chromium and zinc. Such metals are different than the metal of layer 11, which, as defined for this example, is copper. Other metals than chromium and zinc may include indium, tin, nickel, cobalt, molybdenum, aluminum and alloys thereof. In one example, the chromium may possess a thickness on each side of from only about 0.01 micron to about 1.0 micron, while the second layer of zinc may possess a thickness of from only about 0.005 micron to about 0.05 micron. Copper foils treated in this manner are commercially available from Gould, Inc., having a business location in Eastlake, Ohio.

Initial copper surface roughness may vary, depending on the conditions utilized to deposit the copper film. Notably, the roughness of the outer surfaces as a result of adding this second metal does not increase over that of the initial copper surfaces defined above. The surface topographies depicted in the drawings are thus understood to be exaggerated for illustration purposes and are not meant to accurately illustrate the actual roughness of said surfaces. Although electrolytic plating is defined as the preferred approach to adding the second metal, the invention is not limited thereto, as it is possible to add the defined sub-layers using electro-less plating or conventional sputtering. It is also possible to utilize a combination of these processes.

Figure 2:
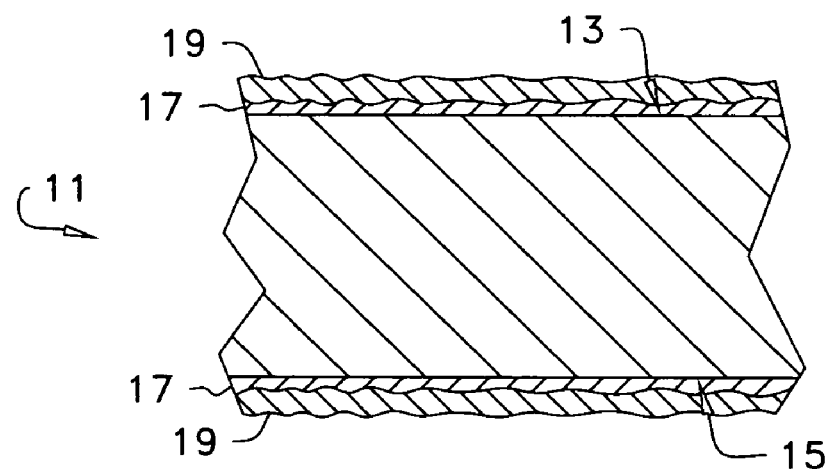
Figure 3:
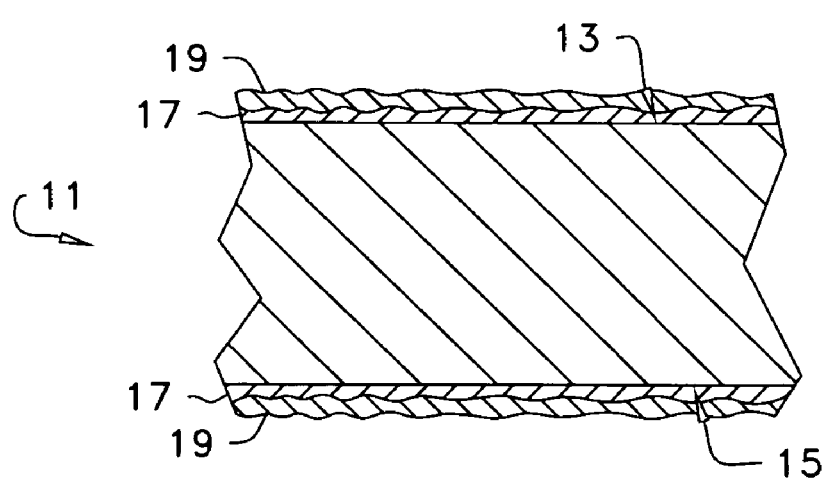
Figure 4:
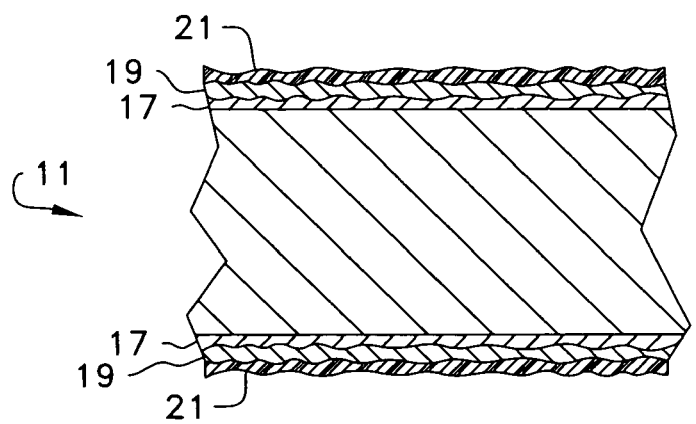

In FIG. 3, the conductive layer of FIG. 2 is shown following exposing of the layer (with the second metal thereon) to a solution so as to reduce the amount of the second metal within said layer of said second metal. In a preferred embodiment, this involves exposing the conductive layer to a stripper solution comprised of a mixture of butyl carbitol and ethanolamine. In this mixture, the butyl carbitol comprises about seventy percent by weight of the composition and the ethanolamine comprises about thirty percent by weight of the composition. Many other such solutions are readily useable and the invention is not limited to the one specified herein. Treatment of the conductive layer with the stripper may be accomplished by passing the layer through a fluid treatment device of the type defined above. During such processing, the stripper is sprayed at a pressure of from about twenty-five pounds per square inch (p.s.i.) to about thirty-five p.s.i. on the exposed external surfaces of the outer sub-layer 19. As represented in the patents cited previously, solution flow is directed laterally across the surfaces. The solution is typically at a temperature of from about 150 degrees Fahrenheit (F.) to about 170 degrees F. Notably, the purpose of this treatment step is to reduce the total content of the metal (in this example, the zinc) in the second metallurgy (in this example, the chromium and zinc). In one example, the zinc may be reduced from approximately eleven percent of the total second metallurgy to only about two percent. Although the above treatment is defined as being accomplished using the defined fluid treatment devices, it is also possible to treat the conductive surfaces by dipping the substrate within the solution for a predetermined time period. The roughness is not altered, however, following this processing, including whether using either the dip or the fluid treatment device approach.

Layer 11 is now subjected to a chemical treatment in which the exposed external surfaces (of the remaining sub-layer 19) are exposed to a solution containing acid, peroxide and a metal (preferably, copper). One preferred process involves processing the invention's foils through what is referred to as a "BondFilm" solution currently available on the marketplace under this name from Atotech Deutschland GmbH, an international company having a U.S.A. business address at 1750 Overview Drive, Rock Hill, S.C. The term "BondFilm" is a trademark of Atotech Deutschland GmbH. This BondFilm solution is comprised primarily of three components: (1) sulfuric acid; (2) hydrogen peroxide; and (3) copper, as well as additional Atotech Deutschland GmbH proprietary constituents. This process is also referred to as an oxide alternative process, meaning that it does not result in the formation of oxide layers on the treated material. The conductive layer is treated with this BondFilm solution, e.g., by immersion for a period of from about 30 to about 200 seconds at a solution temperature of about 25 to 45 degrees Celsius (C.). As part of this treatment, the conductive layer is initially cleaned and degreased, followed by an activation step, following which a micro-etch of the surfaces of sides 13 and 15 occurs. Finally, a thin organic layer (coating) 21 is applied to both of these surfaces. Significantly, this thin organic layer remains on the conductive layer 11 when the layer is bonded to the dielectric layer(s), as defined in greater detail below with respect to FIG. 5. In one example, a preferred organic material is benzotriazole with a thickness only from about 50 Angstroms to about 500 Angstroms. Treatment of copper foil using the above process results in a change to the Rz value (the 10 point average surface roughness) of the conductive layer's outer surface. For example, the Rz roughness prior to treatment may be on the order of about seven microns and the defined treatment will induce an additional micro-roughening on the order of about 1.2 to about 1.5 microns. The purpose of subjecting layer 11 to this "oxide alternative" process, as understood from the foregoing, is to increase the outer roughness only to the point where subsequent lamination to the described dielectric layer(s) results in sound adhesion between both conductive and dielectric layers. Significantly, such roughness is not considered sufficient to substantially adversely affect signal passage should the conductive layer be used as a signal layer, including within high speed substrates as defined above.

Figure 5:
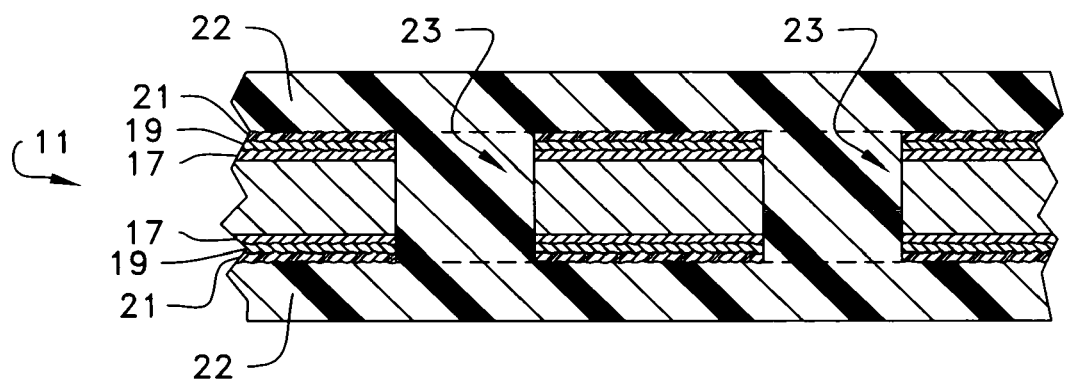
FIG. 5 is a much enlarged, partial side elevational view of the treated layer of FIGS. 1-4 with at least one dielectric layer bonded thereto, forming a circuitized substrate in its simplest form, according to one embodiment of the invention.

In FIG. 5, conductive layer 11, having the Bondfilm material thereon, is bonded to two dielectric layers of the material defined above (preferably that from Asahi Chemical Company), each dielectric layer oriented on opposite sides of the conductive layer and then compressed there-against, preferably utilizing conventional lamination processing. Although two dielectric layers have been described for this lamination, it is possible to only use one, and bond this to only one side of the conductive layer. For purposes of illustration, the dielectric will be referenced by the numeral 22 in FIG. 5 and below. If two layers of the dielectric are used, as preferred, each will have an initial thickness of about two mils. If only one dielectric layer is bonded to one conductive layer, the resulting substrate will include the dielectric as a "base" layer and the one conductive layer will be bonded to one side thereof. This conductive layer may then be "personalized", meaning it is circuitized to form the desired circuit pattern therein, the pattern possibly including signal lines, pads, etc. The dielectric as applied in FIG. 5 substantially fills openings 23 if formed within layer 11 (e.g., if layer 11 is to be used as a power or ground layer and such openings are to form "clearance" openings within the layer). Openings 23, if so used, may be formed using conventional mechanical drilling or the more recently developed laser drilling. Such openings are preferably formed, for reasons understood from the following. The dielectric-conductive structure shown in FIG. 5 may possess a total thickness of from about three to about seven mils. Each opening may have a diameter of about five mils.

It is understood that in its simplest form, the structure depicted in FIG. 5, having a minimum of one conductive layer and one insulating dielectric layer, may function as a circuitized substrate. For example, the substrate may be the single dielectric layer with the "personalized" circuit pattern thereon, or in another embodiment of this single dielectric-single conductive layer form, may serve as a "core" for use with other substrates, including other similar "cores", as part of a multi-layered circuitized substrate such as shown in exploded form in FIG. 7. In one example, the final structure may include no less than ten dielectric and conductive layers and, with respect to more complex final substrate products such as PCBs for products such as information handling systems, may include as many as thirty or more total conductive and dielectric layers.

Figure 6:
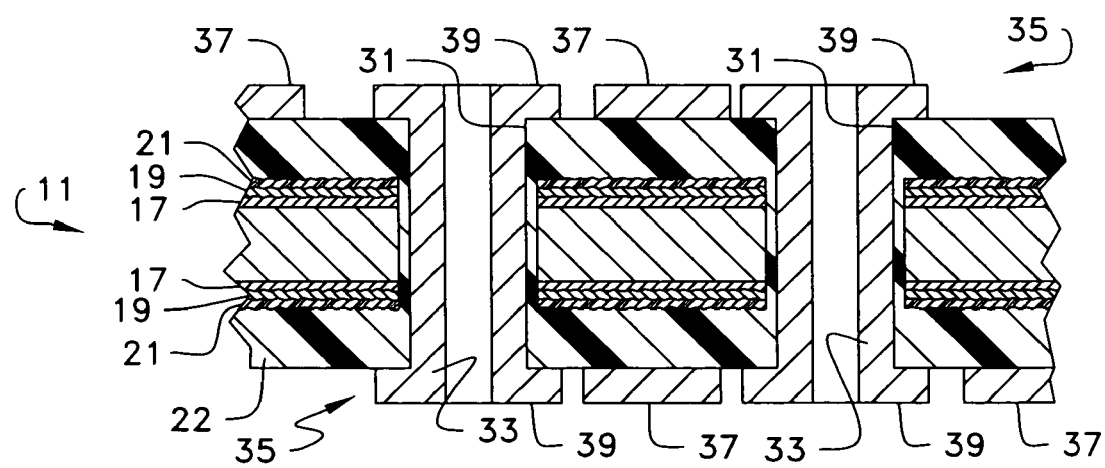
FIG. 6 is a much enlarged, partial side elevational view of the substrate of FIG. 5 with conductive thru-holes provided therein and external circuitry provided on the outer surfaces thereof.

In FIG. 6, the substrate of FIG. 5 is shown as having further processing thereon, to give it greater operational capabilities over the more simplistic version of FIG. 5. Specifically, openings 31 are formed within the structure, to extend through the entire thickness and between the clearance openings 23 so as not to contact the conductive walls of the layer 11. Openings 31 are formed using laser drilling, and may also be formed by known mechanical drills. In one example, each opening 31 may have a diameter of two mils.

Figure 7:
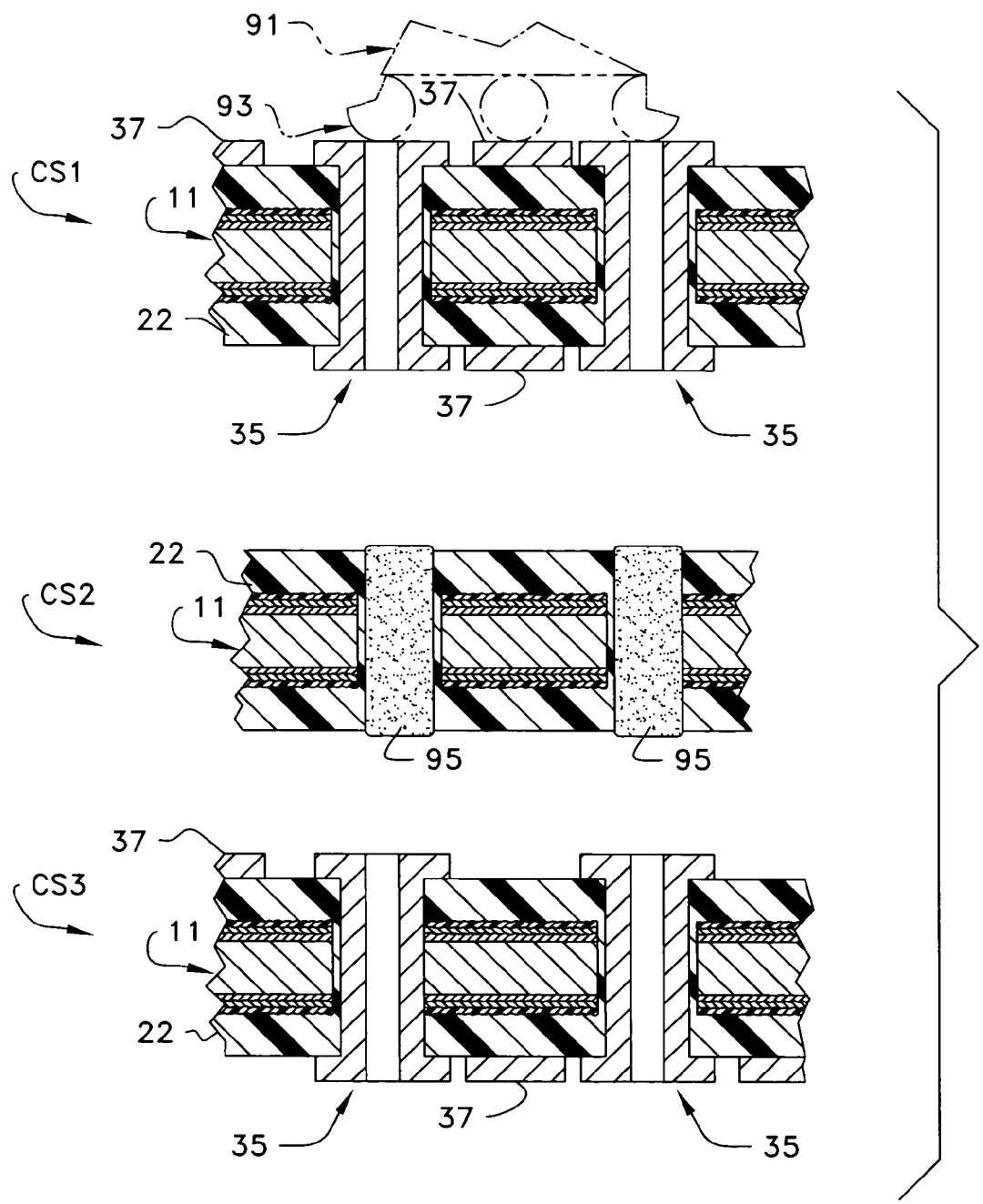
FIG. 7 is an exploded, partial side elevational view, on a smaller scale than the views of FIGS. 1-6, showing a multilayered circuitized substrate comprised of three circuitized substrates which may be formed in accordance with the teachings herein.

The dielectric surfaces of each opening are then plated with a conductive layer 33, preferably copper, using known plating processes. The result is a plated-thru-hole (or PTH) 35 which, in one example, will have copper layers on the internal walls of a thickness of about 0.5 mil. It is also possible to form external circuitry (preferably using known photolithographic processing) such as signal lines or pads 37, and external "lands" 39 for each PTH. Photolithographic processing is known in the art and involves application of a photo-resist material (not shown) over a conductive layer (preferably copper) formed (e.g., laminated) on the external surface and then patterned and exposed (through the pattern). The photo-resist is then "developed" to enable removal of selected portions of the underlying metal in this layer and the formation of several conductors and "lands", such as 37 and 39, respectively. In FIG. 6, conductors 37 may comprise signal conductors designed to carry signals through the structure to designated contact locations, including, if desired, to internal conductive layers (including layer 11) within the structure itself. In one example, conductors 37 may be in the form of very thin signal lines having a width of only about one mil and a thickness of only about 0.5 mil. The lines are in turn spaced apart only two mils to give an excellent idea of the highly dense circuit pattern attainable using the teachings herein. If the upper conductive layer is not used solely as a signal layer, the conductors may also be in the form of pads, such as those adaptable for having a solder connection (i.e. solder balls 93, shown in phantom in FIG. 7) formed thereon to afford connection to an electrical component 91 (e.g., a semiconductor chip) positioned on the finished substrate. Similar pads 37 may be formed on the undersurface of the substrate, including the multilayered substrate shown in FIG. 7, to couple the substrate to an underlying substrate such as a larger PCB (not shown). Again, solder balls may be used to complete these connections. Such substrate-to-PCB solder connections are known in the chip carrier art such that the carrier can be coupled to selected circuitry within and atop the host PCB. Further description is not deemed necessary. The three conductive layered circuitized substrate of FIG. 6, when completed as shown, may have an overall thickness of from about four to about eight mils. In this form, the substrate is preferably utilized with other substrates to form a much larger, multilayered substrate such as shown in FIG. 7. In one example, the FIG. 6 substrate may thus be referred to as a "core", including one with a central power plane (11) and two outer signal planes. Other combinations are, of course, readily possible.

In FIG. 7, three examples of circuitized substrates (referred to as CS1, CS2 and CS3) capable of being formed using the unique teachings of this invention are shown as being aligned, as part of a bonding process (the preferred one being lamination using conventional lamination pressures and temperatures) to bond all three substrates together to form one larger, multilayered substrate. In this case, each includes dielectric material 22, in preferably what is referred to as "B-stage" with respect to its cure state, a well known state for many such dielectric materials. (It is not essential all be at "B-stage", however.) The dielectric material in those substrates which is not fully cured will then reach full cure as a result of the high temperatures reached during lamination. Substrates CS1 and CS3 are preferably similar to the substrate of FIG. 6, including PTHS 35 therein. As a further modification readily possible using the teachings herein, substrate CS3 is shown as having one PTH (to the left) electrically coupled to the internal conductive layer 11. Should layer 11 serve as a ground layer, for example, any circuitry connected to the left side PTH 35 will thus form a ground path for any component coupled thereto. Other possibilities are quickly understood, including layer 11 of substrate CS2 as a power plane. The central substrate CS3 represents a different version from the other two shown in that there are no plated PTHS, but instead only conductive paste 95 is used within the formed openings which extend through the structure. Various examples of known conductive pastes may be used, one example being sold under the product name "TH9910" by Tatsuta System Electronics Company, of Osaka, Japan. This paste includes a copper powder filler and a phenolic resin binder. Pastes including silver powders are also known, one example being sold under the product name "ED2000" by Electra, of Tonbridge, England. In the laminated structure, the pastes serve to interconnect aligned PTHS as shown, but may also be used to couple aligned signal pads or the like, including with PTHS if desired. Substrate CS2 thus serves as an interconnector for the assembly of FIG. 7. Notably, one of the conductive pastes may be coupled to one or more inner conductive layers (11) therein, similar to the connection of the left side PTH in CS3. In FIG. 7, the right side paste-filled opening is shown coupled to internal layer 11. Again, many other alternative constructions are possible, illustrating the versatility of this invention.

As shown, the resulting multilayered substrate of FIG. 7 may include at least one (and preferably two) outer or external conductive layer(s). In one example, the final structure may include no less than ten dielectric and conductive layers and, with respect to more complex final substrate products such as PCBs for products such as information handling systems, may include as many as thirty or more total conductive and dielectric layers. As mentioned, external layers may be formed on the resulting substrate and adapted for being coupled to external electrical components (i.e., semiconductor chip 91) by appropriate connectors (i.e., solder balls 93). As further mentioned, if the multilayered substrate is to be a chip carrier, it then may also be adapted for being positioned on and electrically coupled to a larger PCB (not shown), in which case, solder balls may also be used to coupled the designated pads on the multilayered substrate's conductive undersurface layer to corresponding PCB upper pads. If the multilayered substrate is to be a PCB, then it is possible that only the upper surface thereof include a conductive circuit layer with no such layer on the undersurface. Various combinations are understandably possible using the teachings herein. In either case (the multilayered substrate of FIG. 7 is a PCB or smaller substrate such as a chip carrier), the substrate and its coupled electrical component(s) will form an electrical assembly which may be utilized within an information handling system of the type defined hereinabove (e.g., a personal computer, mainframe computer or computer server). Other types of information handling systems and other products which utilize substrates known in the art may also utilize the teachings of this invention.

Thus there has been shown and described a method of forming a conductive layer which can be readily utilized within a circuitized substrate. This layer affords excellent adhesion to selected dielectric layers and excellent signal passage, including "high speed" signals, if the layer is chosen for this purpose. The methods taught herein include the formation of a circuitized substrate including such an advantageous conductive layer (and possibly many of same) which can then be used with other substrates to form a much larger multilayered substrate. The circuitized substrates formed herein may be produced using known PCB and/or chip carrier or the like manufacturing processes and are thus producible at relatively low cost, enabling the passage of such low costs on to assemblies utilizing these substrates.

While there have been shown and described what are at present the preferred embodiments of the invention, it will be obvious to those skilled in the art that various changes and modifications may be made therein without departing from the scope of the invention as defined by the appended claims.

What is claimed is:

1. A method of treating a conductive layer for use in a circuitized substrate, said method comprising:
    providing a conductive layer of a first metal having at least one smooth side including a first roughness;
    depositing a layer of a second metal different than said first metal on said at least one smooth side of said conductive layer;
    exposing said layer of said second metal on said at least one smooth side of said conductive layer to a solution to reduce the amount of said second metal within said layer of said second metal; and
    providing a thin polymer layer on said layer of said second metal after said reducing of said second metal to protect said layer of said second metal and to increase the roughness of said conductive layer to a second roughness greater than said first roughness.

2. The method of claim 1 wherein said depositing of said layer of said second metal different than said first metal on said at least one smooth side of said conductive layer is accomplished using electrolytic plating.

3. The method of claim 1 wherein said layer of said second metal comprises at least two sub-layers, each of a different metal.

4. The method of claim 3 wherein a first of said sub-layers comprises chromium and a second of said sub-layers comprises zinc.

5. The method of claim 4 wherein said sub-layers are deposited using electrolytic plating.

6. The method of claim 1 wherein said exposing of said layer of said second metal to a solution to reduce the amount of said second metal within said layer of said second metal comprises exposing said layer of said second metal to a stripper solution.

7. The method of claim 6 wherein said stripper solution comprises butyl carbitol and ethanolamine.

8. The method of claim 1 wherein said thin polymer layer on said layer of said second metal after said reducing of said second metal to protect said layer of said second metal and to increase the roughness of said conductive layer to a second roughness greater than said first roughness comprises benzotriazole.

9. The method of claim 1 wherein said exposing of said layer of said second metal on said at least one smooth side of said conductive layer to a solution to reduce the amount of said second metal within said layer of said second metal is accomplished using a fluid treatment device.

10. A method of making a circuitized substrate, said method comprising:
    providing a conductive layer of a first metal having at least one smooth side including a first roughness;
    depositing a layer of a second metal different than said first metal on said at least one smooth side of said conductive layer;
    exposing said layer of said second metal on said at least one smooth side of said conductive layer to a solution to reduce the amount of said second metal within said layer of said second metal;

providing a thin polymer layer on said layer of said second metal after said reducing of said second metal to protect said layer of said second metal and to increase the roughness of said conductive layer to a second roughness greater than said first roughness;

providing a dielectric layer;

bonding said conductive layer to said dielectric layer such that said layer of said second metal on said conductive layer having said thin polymer layer thereon contacts said dielectric layer; and forming a circuit pattern within said conductive layer.

11. The method of claim 10 wherein said depositing of said layer of said second metal different than said first metal on said at least one smooth side of said conductive layer is accomplished using electrolytic plating.

12. The method of claim 10 wherein said layer of said second metal comprises at least two sub-layers, each of a different metal.

13. The method of claim 12 wherein said sub-layers are deposited using electrolytic plating.

14. The method of claim 10 wherein said exposing of said layer of said second metal to a solution to reduce the amount of said second metal within said layer of said second metal comprises exposing said layer of said second metal to a stripper solution.

15. The method of claim 10 wherein said exposing of said layer of said second metal on said at least one smooth side of said conductive layer to a solution to reduce the amount of said second metal within said layer of said second metal is accomplished using a fluid treatment device.

16. The method of claim 10 wherein said bonding of said electrically conductive layer to said dielectric layer is accomplished using a lamination process.

17. The method of claim 10 further including providing a plurality of conductive openings within said circuitized substrate following said bonding of said electrically conductive layer to said dielectric layer.

18. The method of claim 10 wherein said forming of said circuit pattern within said electrically conductive layer is accomplished using photolithographic processing.

19. The method of claim 10 further including bonding additional dielectric and electrically conductive layers on opposite sides of said circuitized substrate having said dielectric layer and said electrically conductive layer, and forming a circuit pattern within selected ones of said additional electrically conductive layers.

20. The method of claim 19 further including positioning at least one electrical component on said circuitized substrate and electrically coupling said at least one electrical component to one or more of said electrically conductive layers to form an electrical assembly.

21. The method of claim 10 further including positioning at least one electrical component on said circuitized substrate and electrically coupling said at least one electrical component to said electrically conductive layer to form an electrical assembly.

* * * * *